(12) United States Patent
Lee et al.

(10) Patent No.: US 7,678,242 B2
(45) Date of Patent: Mar. 16, 2010

(54) SYSTEM AND METHOD FOR MANUFACTURING FLEXIBLE COPPER CLAD LAMINATE FILM

(75) Inventors: Hong Kee Lee, Goyang-si (KR); Seong-Ho Son, Goyang-si (KR); Seok Bon Koo, Bucheon-si (KR)

(73) Assignee: Korea Institute of Industrial Technology, Chonan-Si, Chungcheongnam-Do (KR)

( * ) Notice: Subject to any disclaimer, the term of this patent is extended or adjusted under 35 U.S.C. 154(b) by 1135 days.

(21) Appl. No.: 11/294,221

(22) Filed: Dec. 5, 2005

(65) Prior Publication Data

US 2007/0032080 A1   Feb. 8, 2007

(30) Foreign Application Priority Data

Aug. 3, 2005   (KR) ...................... 10-2005-0070844

(51) Int. Cl.
*C25D 17/00* (2006.01)
(52) U.S. Cl. ..................... 204/206; 204/202; 204/207; 205/138
(58) Field of Classification Search ................ 204/198, 204/202, 206, 207, 208; 205/138
See application file for complete search history.

(56) References Cited

U.S. PATENT DOCUMENTS

| | | | | |
|---|---|---|---|---|
| 2,377,637 A | * | 6/1945 | Joseph Lloyd | .............. 118/413 |
| 4,175,018 A | * | 11/1979 | Gacesa | ........................ 204/488 |
| 4,183,799 A | * | 1/1980 | Sellitto et al. | ............... 204/206 |
| 4,351,713 A | * | 9/1982 | Hirt et al. | .................... 204/207 |
| 4,393,772 A | * | 7/1983 | Burger | ........................ 101/217 |
| 4,677,002 A | * | 6/1987 | Poterala | ..................... 427/356 |
| 4,994,839 A | * | 2/1991 | Yamakoshi | ................. 396/624 |
| 5,755,935 A | * | 5/1998 | Jackson et al. | .............. 204/202 |
| 5,776,327 A | * | 7/1998 | Botts et al. | ..................... 205/96 |
| 5,804,466 A | * | 9/1998 | Arao et al. | .................... 438/95 |
| 2004/0108211 A1 | | 6/2004 | Chiu et al. | .................... 205/76 |

\* cited by examiner

*Primary Examiner*—Nam X Nguyen
*Assistant Examiner*—Luan V Van
(74) *Attorney, Agent, or Firm*—Conley Rose, P.C.; J. Robert Brown, Jr.

(57) ABSTRACT

Disclosed is a system and a method for manufacturing flexible copper clad laminate film capable of efficiently electroplating both surfaces of a polyimide-based film to form copper plating layers thereon while making it easy to repair and maintain the apparatus or clean its plating or cleaning bath. The system includes a pickling device adapted to spray a pickling liquid to both surfaces of a to-be-plated film to remove oxide coatings from the copper coatings; a number of water-cleaning devices for removing the pickling liquid and copper electrolyte remaining on the film; at least one plating device positioned between the water-cleaning devices to form copper plating layers on both surfaces of the film; an antirust device for preventing the copper plating layers, which have been formed by the plating device, from rusting; and a drying device for drying the antirust liquid on the film, which has been subjected to antirust treatment.

18 Claims, 12 Drawing Sheets

SYSTEM AND METHOD FOR MANUFACTURING FLEXIBLE COPPER CLAD LAMINATE FILM

TECHNICAL FIELD

The present invention relates to a system and a method for manufacturing a flexible copper clad laminate film (hereinafter, referred to as FCCL).

BACKGROUND ART

As widely known in the art, an FCCL film is a polyimide-based film having a copper plating layer laminated on its surface and is a very important basic element in producing FPCBs (flexible printed circuit boards) used in mobile telephones, LCDs, PDPs, digital cameras, and laptop computers. Methods for applying a copper plating layer to a surface of a polyimide-based film to manufacture an FCCL include a method of using an adhesive to attach the copper plating layer to the surface of the polyimide-based film, and another method of electroplating the surface of a polyimide-based film, which has a copper coating formed thereon, with copper to laminate a copper plating layer on the film.

However, conventional copper plating and cleaning apparatuses used to manufacture FCCLs according to the latter method, i.e. electroplating method, have a problem in that since the copper plating layer is formed on a single surface of the polyimide-based film, they exhibit low productivity and efficiency in producing FCCLs having copper plating layers laminated on their both surfaces, which are used to produce multilayered FPCBs for high densification of circuit patterns.

Furthermore, conventional copper plating and cleaning apparatuses used to manufacture FCCLs have a large number of components including electrodes, feed rolls, and spray nozzles installed in a plating or cleaning bath, in order to dip a polyimide-based film being continuously supplied into a working fluid as well as perform plating or cleaning processes of it. In addition, electrical lines and fluid tubes connected to the components make it difficult to repair and maintain them or clean the plating or cleaning bath.

DISCLOSURE OF THE INVENTION

Therefore, the present invention has been made in view of the above-mentioned problems, and it is an object of the present invention to provide a system and a method for manufacturing FCCLs capable of efficiently electroplating both surfaces of a polyimide-based film to form copper plating layers thereon while making it easy to repair and maintain the apparatus or clean its plating or cleaning bath.

According to an aspect of the present invention, there is provided a flexible copper clad laminate manufacturing system for continuously plating a to-be-plated film, which has copper coatings on both surfaces thereof, to form copper plating layers on both surfaces of the film while it is fed, the system including a pickling device adapted to spray a pickling liquid to both surfaces of the to-be-plated film to remove oxide coatings from the copper coatings; a number of water-cleaning devices for removing the pickling liquid and copper electrolyte remaining on the film; at least one plating device positioned between the water-cleaning devices to form copper plating layers on both surfaces of the film; an antirust device for preventing the copper plating layers, which have been formed by the plating device, from rusting; and a drying device for drying the antirust liquid on the film, which has been subjected to antirust treatment.

According to another aspect of the present invention, there is provided an FCCL manufacturing method for continuously forming copper plating layers on both surfaces of a polyimide-based film, which has copper coatings formed on both surfaces thereof, as a to-be-plated object, the method including a pickling step of spraying a thin acid solution to both surfaces of the to-be-plated object to remove oxide coatings formed on the copper coatings; a first cleaning step of spraying a cleaning liquid to the pickled object to remove the pickling liquid remaining thereon; a plating step of forming copper plating layers, including copper nuclei, on the copper coatings using a copper electrolyte as the working fluid; and a second cleaning step of removing the copper electrolyte remaining on the copper coating layers using DI water as the working fluid, wherein the plating and second cleaning steps are repeated at least one time.

BRIEF DESCRIPTION OF THE DRAWINGS

The foregoing and other objects, features and advantages of the present invention will become more apparent from the following detailed description when taken in conjunction with the accompanying drawings in which.

BEST MODE FOR CARRYING OUT THE INVENTION

Figure 1:
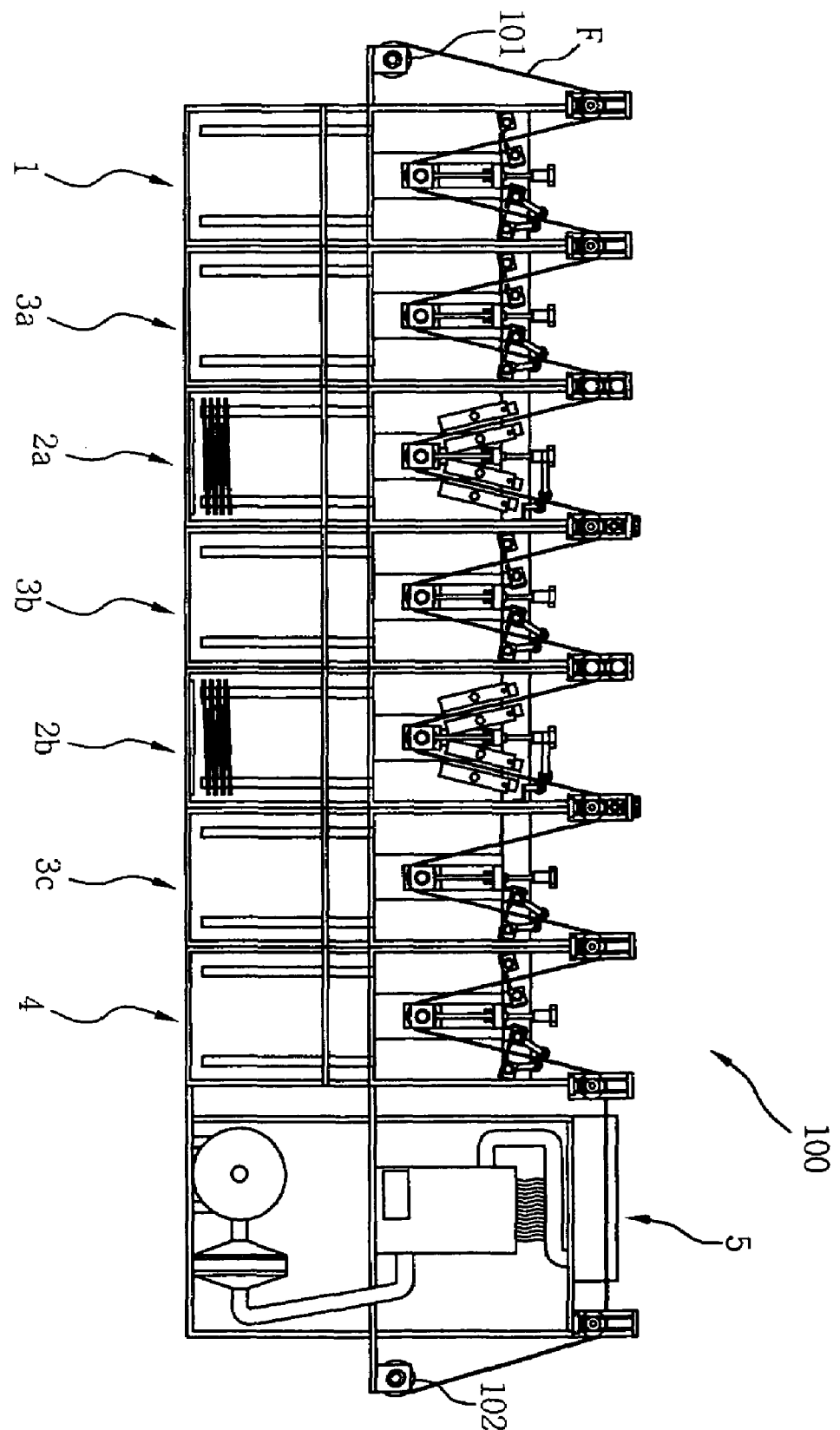
FIG. 1 is a sectional view briefly showing the overall construction of a flexible copper clad laminate film manufacturing system according to the present invention.

Preferred embodiments of the present invention will now be described in more detail with reference to the accompanying drawings.

In the drawings, the same components are given the same reference numerals and repeated description thereof will be omitted.

FIG. 1 is a sectional view briefly showing the overall construction a flexible copper clad laminate film manufacturing system according to the present invention. In the FCCL manufacturing system 100, referring to FIG. 1, a polyimide-based film is continuously supplied as a to-be-plated object and has thin copper coatings on its both surfaces. The polyimide-based film (hereinafter, referred to as a to-be-plated film F) is wound around a to-be-plated film supply device 101 (hereinafter, referred to as a supply device), which is positioned on the front end of the FCCL manufacturing system 100. To manufacture an FCCL, the FCCL manufacturing system 100 plates the film F in such a manner that copper layers are formed on copper coatings positioned on both surfaces thereof, respectively, with a thickness of 8-30 μm.

The FCCL film manufacturing system 100 according to the present invention, as shown in FIG. 1, includes a supply device 101 positioned on its front end to supply a to-be-plated film F; a pickling device 1 for pickling the film F supplied from the supply device 101; first, second, and third water-cleaning devices 3a, 3b, and 3c for cleaning the film F, which has been pickled by the pickling device 1 and plated by at least one plating devices, with a cleaning liquid, such as DI water (de-ionized water); first and second plating devices 2a and 2b for plating the cleaned film F, in such a manner that copper plating layers are formed on copper coatings on both surfaces thereof; an antirust device 4 for spraying an antirust liquid to the copper plating layers on the film F to prevent them corroding; a drying device 5 for drying the antirust liquid on the film F, which has been plated; and a winding device 102 positioned on the rear end of the drying device 5 to draw the film F wound around the supply device 101. These devices are detachably connected to one another and are positioned on a single frame.

The to-be-plated object, for example, a to-be-plated film F having copper coatings on both surfaces thereof and having a width of 150 mm, is pre-treated for copper plating by a pre-treating device, and is wound into a roll to be mounted on a rotation shaft of the supply device 101. As the winding device 102 is actuated, the film F is rotated together with the rotation shaft of the supply device 101, and is fed to the pickling device 1 at a speed of about 0.1 m/min. The supply device 101 is provided with a magnetic brake (not shown) to maintain a predetermined supply speed of the film F without any abrupt change. The winding device 102 has a motor as a driving device and a rotation shaft connected thereto to feed the film F at a speed of 0.1 m/min.

The pickling device 1 is adapted to remove oxide coatings from the upper and lower surfaces of the film F supplied from the supply device 101 using a thin acid solution as the pickling liquid. In the pickling device 1, a pickling liquid is sprayed to the upper and lower surfaces of the film F, which is also dipped into the pickling liquid contained in a pickling liquid reservoir, so that oxide coatings are removed from both surfaces. The construction of the pickling device 1 is identical to that of the water-cleaning devices 3a and 3c, except for the cleaning liquid used as the working fluid, and will be referred to later when describing the cleaning devices.

The to-be-plated film F is, as mentioned above, a polyimide-based film having thin copper coatings on both surfaces thereof. The copper coatings are very likely to oxidize in the air, and oxide coatings created on their surfaces make it difficult to form copper plating layers. Therefore, it is preferred to remove copper coatings from the film F before plating treatment to improve plating efficiency and quality.

The first water-cleaning device 3a uses a cleaning liquid to remove the acid solution remaining on the surfaces of the film F, which has passed through the pickling device 1. The first water-cleaning device 3a has the same overall construction as the pickling device 1, except that it uses DI water as the cleaning liquid.

The plating devices 2a and 2b have a pair of conductive rolls (described later in more detail) adapted contact the upper and lower surfaces of the film F, respectively, and feed it. Negative (−) current is supplied to the conductive rolls and positive (+) current is supplied to a pair of jigs positioned in the plating baths, in which plating liquid, i.e. copper electrolyte is contained, of the plating devices 2a and 2b. As the negatively-charged film F passes through the positively-charged jigs, therefore, copper plating layers are formed on both surfaces of the film F.

The first and second plating devices 2a and 2b have the same construction. As the film F passes through the first plating device 2a, copper nuclei accumulate on the copper coatings formed on both surfaces of the film, and primary copper plating layers are created. Due to the copper nuclei, the second plating device 2b can efficiently form copper plating layers on both surfaces of the film F with a desired thickness. As such, the first plating device 2a facilitates the formation of copper plating layers in the second plating device 2b.

The second and third water-cleaning devices 3b and 3c use DI water as the cleaning liquid to remove the copper electrolyte remaining on the surfaces of the plating layers formed on both surfaces of the film F while it passes through the first and second plating devices 2a and 2b, respectively. Their construction is the same as the first cleaning device, so repeated description thereof will be omitted.

The antirust device 4 has the same construction as the cleaning devices, except that it uses an antirust liquid instead of the cleaning liquid. In the antirust device 4, an antirust liquid is sprayed to both surfaces of the film F, on which plating layers are formed, and the film F is also dipped into the antirust liquid so that the copper plating layers are prevented from rusting. The drying device 5 has a heater and a blower (not shown) to dry the antirust liquid remaining on the surfaces of the plating layers with hot wind. The film F is then wound into a roll around the winding device 102.

Figure 2:
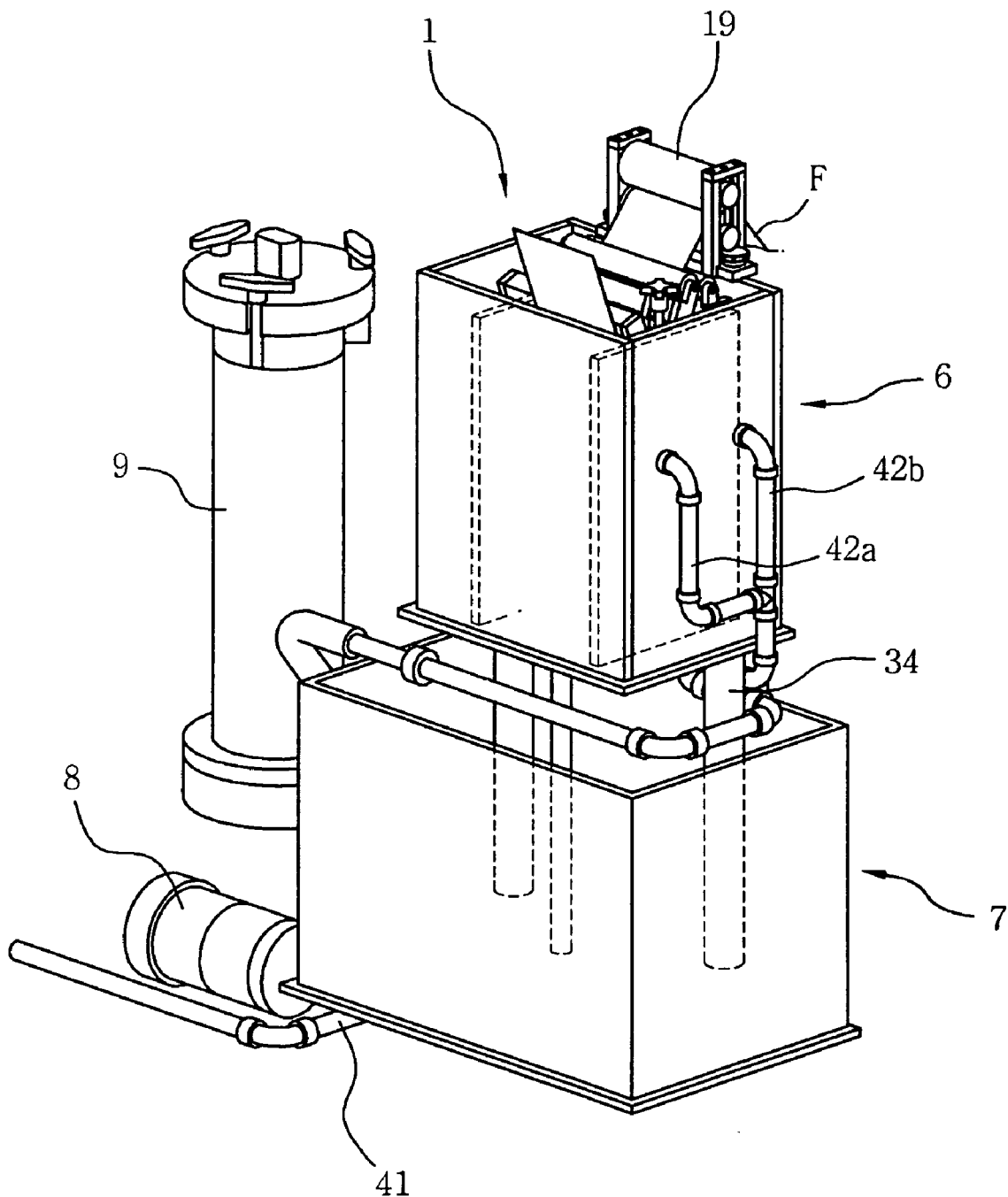
FIG. 2 is a perspective view briefly showing the overall construction of a pickling device, water-cleaning device, or antirust device, used in the flexible copper clad laminate film manufacturing system according to the present invention.
Figure 3:
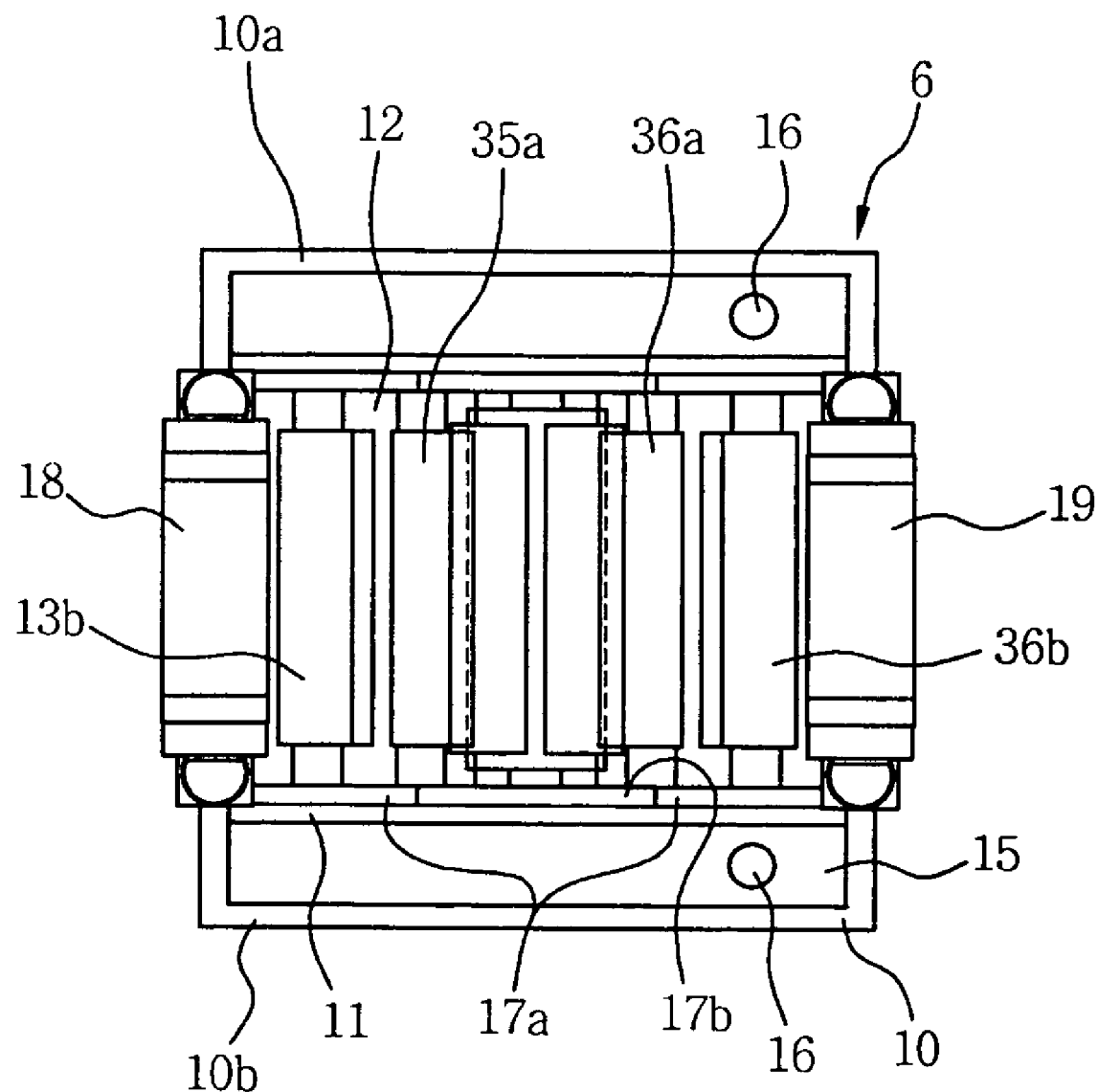
FIG. 3 is a top view of the pickling device, water-cleaning device, or antirust device, shown in FIG. 2.
Figure 4:
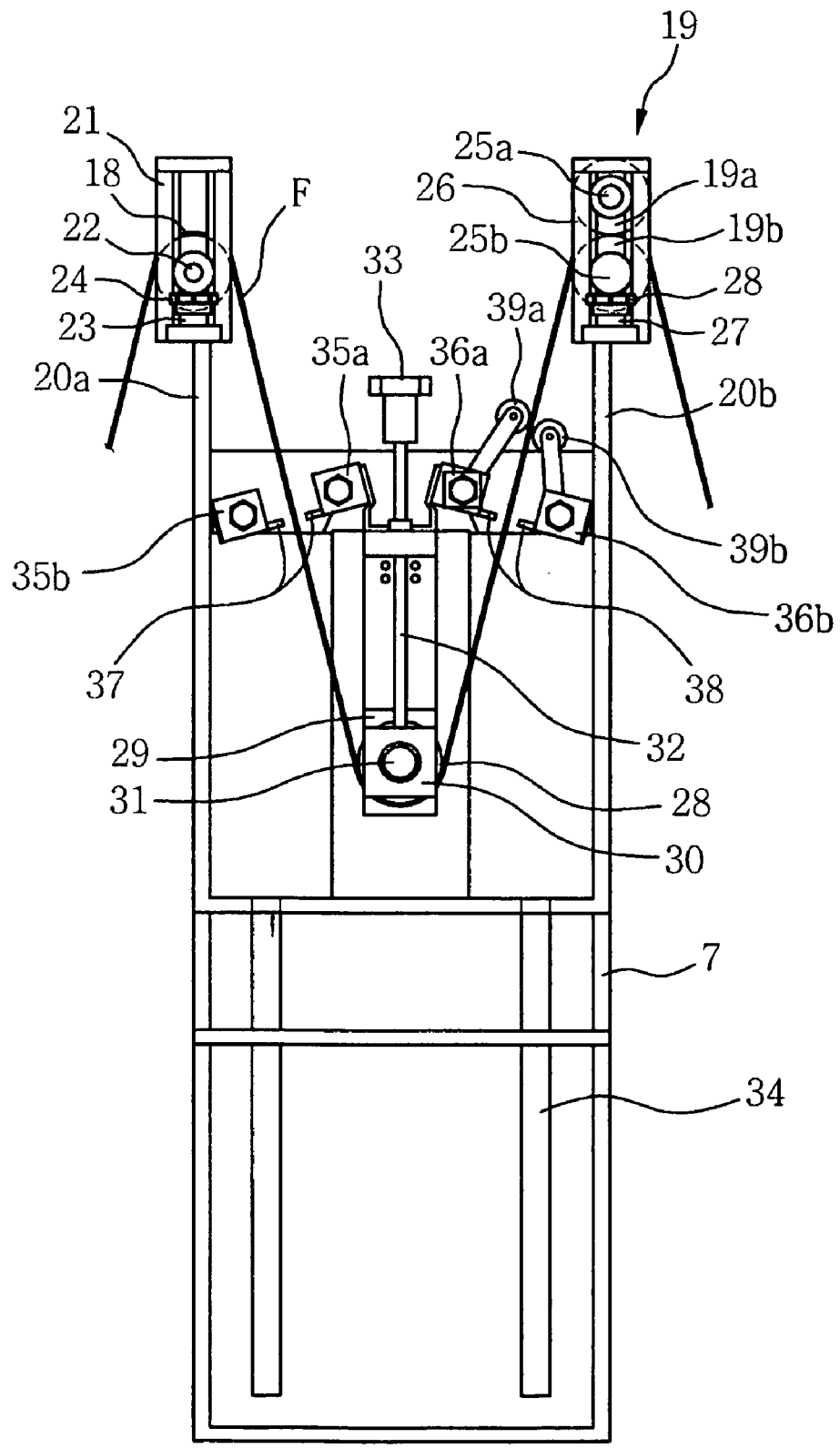
FIG. 4 is a lateral view of the pickling device, water-cleaning device, or antirust device, shown in FIG. 2.
Figure 5:
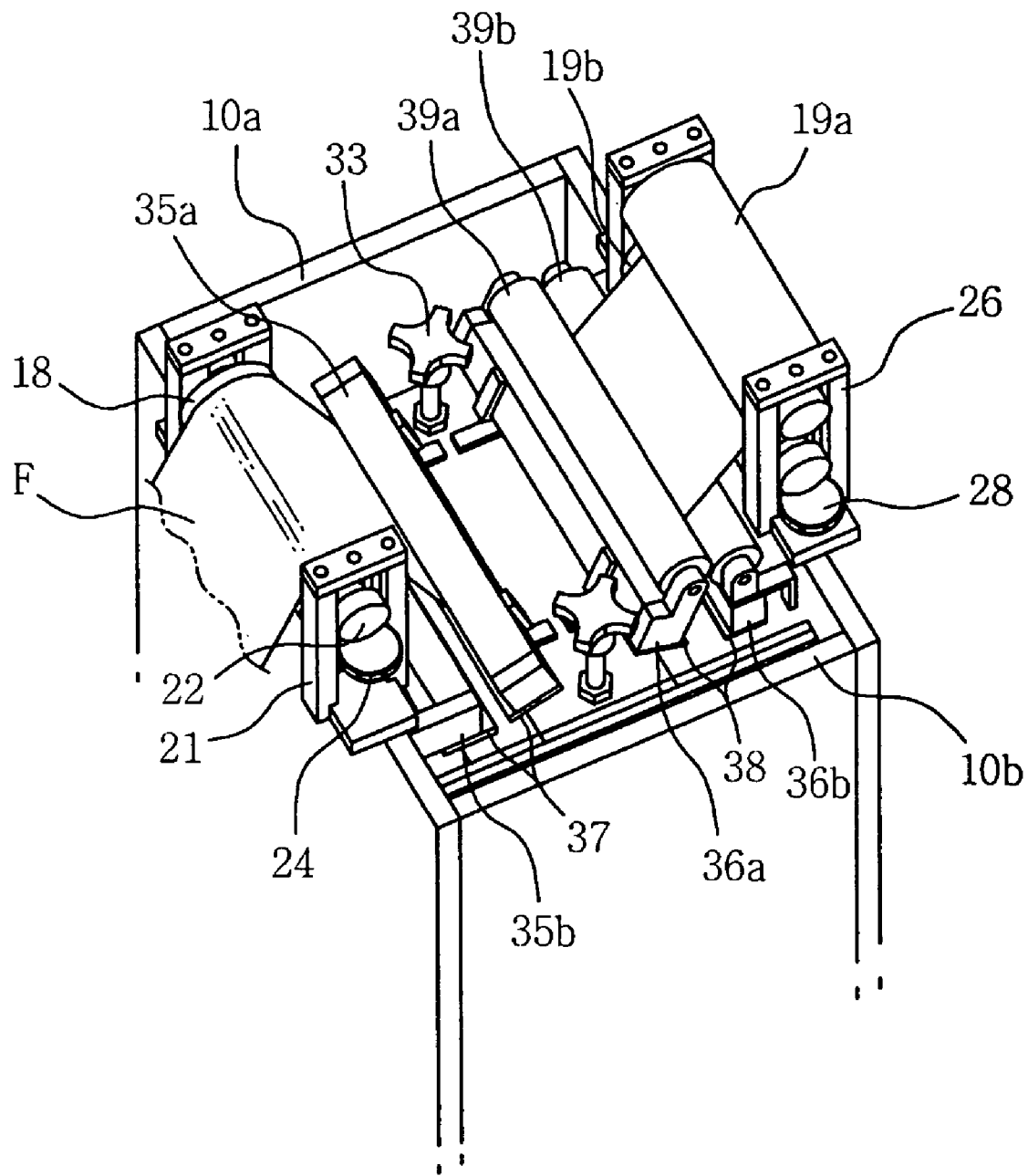
FIG. 5 is a perspective view showing, from above, the pickling device, water-cleaning device, or antirust device, shown in FIG. 2.
Figure 6:
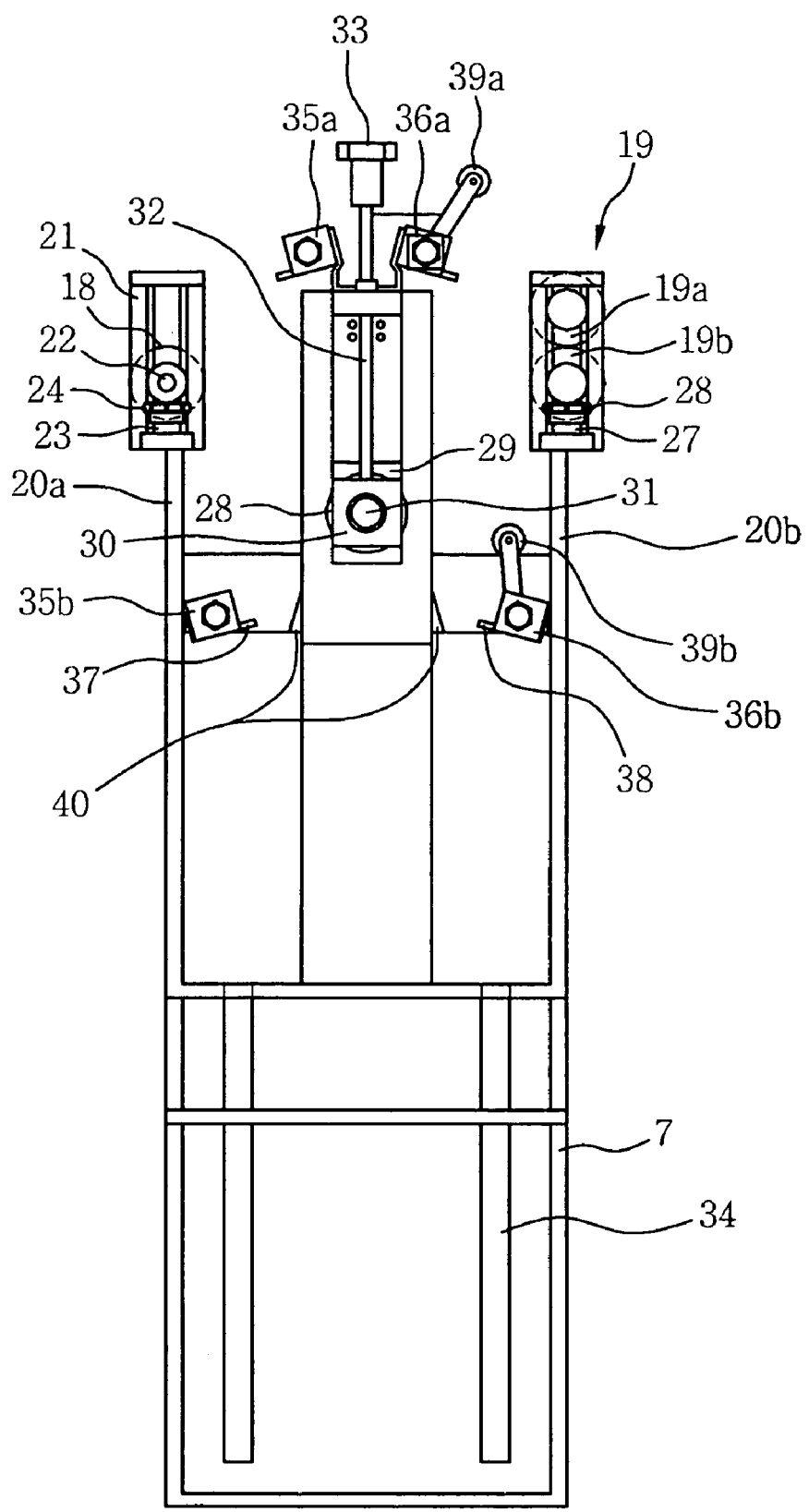
FIG. 6 is a lateral view of the pickling device, water-cleaning device, or antirust device, shown in FIG. 2, with its movable lateral walls raised.

FIG. 2 is a perspective view briefly showing the overall construction of the pickling device, water-cleaning device, or antirust device, used in the FCCL film manufacturing system according to the present invention shown in FIG. 1. FIG. 3 is a top view of the pickling device, water-cleaning device, or antirust device, shown in FIG. 2. FIG. 4 is a lateral view of the pickling device, water-cleaning device, or antirust device, shown in FIG. 2. FIG. 5 is a perspective view showing, from above, the pickling device, water-cleaning device, or antirust device, shown in FIG. 2. FIG. 6 is a lateral view of the pickling device, water-cleaning device, or antirust device, shown in FIG. 2, with its movable lateral walls raised.

As mentioned above, the pickling device 1, the first to third water-cleaning devices 3a to 3c, and the antirust device 4 have the same construction, except for the type of liquid employed, and will now be described as a whole with reference to the cleaning device 1.

The cleaning device 1, as shown in FIG. 4, includes a cleaning bath 6 provided with a number of nozzles 35a, 35b, 36a, and 36b for cleaning a to-be-plated film F and adapted to contain a cleaning liquid sprayed from the nozzles 35a, 35b, 36a, and 36b; a cleaning liquid reservoir 7 for reserving a cleaning liquid to be supplied to the nozzles 35a, 35b, 36a, and 36b; a feed pump 8 for pumping the cleaning liquid from the reservoir 7 to the cleaning bath 6 and the nozzles 35a, 35b, 36a, 36b and replenishing the cleaning liquid reservoir 7 from an external cleaning liquid tank; and a filter 9 for filtering out alien substances from the cleaning liquid supplied to the cleaning bath 6. As shown in FIG. 2, each of the above components is positioned on a single support frame, as shown in FIG. 1, and constitutes a cleaning device 1.

Referring to FIGS. 2 to 5, the cleaning bath 6 includes an external case 10 having the shape of a box with an opened top and a pair of internal walls 11 spaced inwardly by a predetermined distance from both lateral walls 10a and 10b of the external case 10. The height of the internal walls 11 is lower than that of the external case 10, as is clearly seen in FIG. 2, and the space between the internal walls 11 is defined as a treatment bath 12 for cleaning the film F. The space between the internal walls 11 and the external case 10 acts as a discharge bath 15 for discharging a portion of the cleaning liquid, which has flown over the internal walls 11, to the cleaning liquid reservoir 7.

The treatment bath 12 contains the cleaning liquid (not shown) and the discharge bath 15 collects the cleaning liquid, which has flown over the internal walls 11 constituting the cleaning bath 12, to discharge it to the cleaning liquid reservoir 7 positioned below the cleaning bath 6 via four discharge openings 16 formed on the bottom thereof. The internal walls 11 have stationary lateral walls 17a positioned on both sides of their both inner surfaces and movable lateral walls 17b coupled between the stationary lateral walls 17a in such a manner that they can slide upwards and downwards.

The external case 10 has an upper guide roll 18 positioned on its upper portion in front of the treatment bath 12 to guide the to-be-plated film F and feed rolls 19 positioned on its upper portion in rear of the treatment bath 12 to facilitate feeding of the film F. The upper guide roll 18 is positioned in a guide roll support member 21, which is fixed to the upper portion of the front wall 20a of the external case 10, in such a manner that it can be rotated and lifted/lowered. The guide roll support member 21 has elongated holes (not shown) extending in the vertical direction, in which both ends of a shaft 22 of the upper guide roll 18 are rotatably positioned so that the upper guide roll 18 can rotate about the shafts 22. Both sides of the upper guide roll 18 are supported by height adjustment knobs 24, which have threaded shafts 23 screw-coupled to the guide roll support member 21, as shown in FIG. 4. By rotating the height adjustment knobs 24, therefore, the height of the upper guide roll 18 can be adjusted minutely.

The external case 10 may have feed rolls 19 or conductive rolls 59 positioned its rear wall 20b facing the upper guide roll 18, in order to facilitate feeding of the film F while being drawn by the winding device 102 or plate copper plating layers on copper coatings formed on the film F. The feed rolls 19 are made of rubber so that the film F is endowed with frictional force for easy feeding. The upper guide roll 18 is made of a non-conductive synthetic resin, such as Teflon, to guide the film F, which is fed by the rotating force of the winding device 102 and the feeding force of the feeding rolls 19.

The feed rolls 19 are composed of a pair of upper and lower feed rolls 19a and 19b, as shown in FIG. 4. The upper and lower feed rolls 19a and 19b have shafts 25a and 25b positioned in elongated holes formed in a feed roll support member 26 in the vertical direction, respectively, as in the case of the upper guide roll 18. Both sides of the shaft 25b are supported by height adjustment knobs 28, which have threaded shafts 27 screw-coupled to the feed roll support member 26, so that the height can be adjusted by rotating the height adjustment knobs 28.

The treatment bath 12 has a lower guide roll 28 which is positioned between the upper guide roll 18 and the feed rolls 19 to guide the film F in the lower central region of the treatment bath 12. The lower guide roll 28 has a shaft 31 positioned in a slider 30, which is fitted into rectangular holes 29 formed on the lower central portion of the pair of facing movable lateral walls 17b while extending in the vertical direction, as shown in FIGS. 4 and 6 in more detail. The slider 30 is connected to lower roll height adjustment knobs 33 via threaded shafts 32, which are screw-coupled to the upper portion of movable lateral walls 17b.

As the slider 30 is lifted/lowered in the rectangular hole 29 by rotating the lower roll height adjustment knobs 33, the height of the lower guide roll 28 is adjusted minutely. As a result, the lower guide roll 28 can rotate with its outer peripheral surface contacting the upper surface of the film F in a correct position and guide the feeding of the film F inside the lower portion of the treatment bath 12.

As is clear from FIG. 4, the feeding path of the film F in the water-cleaning device extends from the upper portion of the treatment bath 12 to the lower portion, where it bends and extends up to the upper portion. The lower guide roll 28 is positioned in such a manner that the feeding path bends around it. It can be understood by those skilled in the art that the feeding path of the film F generally has a V-shaped configuration when viewed in the lateral direction of the treatment bath 12. The slope of the feeding path can be adjusted by varying the vertical position of the upper guide roll 18, the lower guide roll 28, or the feed rolls 19. Particularly, the dipping depth of the film F into cleaning liquid in the treatment bath 12 depends on the vertical position of the lower guide roll 28.

A pair of facing spray nozzles 35a and 35b are positioned at both sides of the feeding path of the film F between the upper and lower guide rolls 18 and 28 in the treatment bath 12, respectively, and another pair of facing spray nozzles 36a and 36b are positioned at both sides thereof between the lower guide roll 28 and the feed rolls 19 (or conductive rolls in the case of a plating device), respectively. Inner spray nozzles 35a and 36a are positioned on the movable lateral walls 17b and outer spray nozzles 35b and 36b are positioned on the external case 10, as shown in FIG. 4.

The film F passes between the spray nozzles 35a and 35b, which face each other, as well as the spray nozzles 36a and 36b, which face each other. The spray nozzles 35a and 35b have spray slits 37 and 38 formed thereon, respectively, which face each other and spray a cleaning liquid, such as DI water, to both surfaces of the film F for cleaning. In the cleaning device 1, the film F can be cleaned by the spraying of cleaning liquid from the spray nozzles 35a, 35b, 36a, and 36b and by being dipped into the cleaning liquid contained in the treatment bath 12. The cleaning liquid sprayed from the nozzles 35a, 35b, 36a, and 36b with a high pressure is supplied from the cleaning liquid reservoir 7 by the feed pump 8.

In order to remove the cleaning liquid remaining on the film F which has been cleaned by the cleaning liquid sprayed from the spray nozzles 35a, 35b, 36a, and 36b, as well as by being dipped into the cleaning liquid contained in the treatment bath 12, the spray nozzles 36a and 36b positioned between the lower guide roll 28 and the feed rolls 19 (or conductive rolls in the case of a plating device) are provided with a pair of squeeze rolls 39a and 39b, respectively. The squeeze rolls 39a and 39b are preferably sponge rolls made of polypropylene (PP), for example, to prevent the film F from being damaged.

Referring to FIG. 6, the movable lateral walls 17b are shown to be raised from the position shown in FIG. 4 for easy cleaning or repair of the treatment bath 12. The movable lateral walls 17b have a number of supporters 40 positioned on both sides of their lower portion, as shown in FIG. 6. The supporters 40 are adapted to protrude outwards by means of elastic devices, such as springs, and are supported on the upper ends of the stationary lateral walls 17a, which positioned on both sides of the movable lateral walls 17b, when the movable lateral walls 17b are raised. When the movable lateral walls 17b are to be returned from the position shown in FIG. 6 to that shown in FIG. 4, the user places the supporters 40 inside the movable lateral walls 17b, which are then positioned between the stationary lateral walls 17a.

As the movable lateral walls 17b are raised, the lower guide roll 28, the inner spray nozzles 35a and 36a, and the inner squeeze roll 39a, which are positioned thereon, are raised together with the movable lateral walls 17b. In this state, each component of the cleaning bath 6 can be easily repaired and the lower portion of the treatment bath 12 can be easily cleaned.

The cleaning liquid reservoir 7, which is positioned on the lower portion of the cleaning bath 6 constructed as above, has the shape of a box with an opened top. Four discharge tubes 34 extend into the reservoir 7 while being connected to the discharge openings 16 formed on the bottom of the discharge bath 15. Therefore, any cleaning liquid flowing over the treatment bath 12 is collected by the discharge bath 15 and is discharged to the reservoir 7 via the discharge tubes 34.

As shown in FIG. 2, the feed pump 8 is positioned on the lateral lower portion of the cleaning liquid reservoir 7. The feed pump 8 is connected to the lower portion of the reservoir 7, via a conduit 41, in order to pump the cleaning liquid reserved in the reservoir 7 to the filter 9 and to remove impurities from the cleaning liquid. After impurities are removed by the filter 9, the cleaning liquid is supplied to the spray nozzles 35a, 35b, 36a, and 36b via inlet tubes 42a and 42b, which are connected to the spray nozzles 35a, 35b, 36a, and 36b, respectively. After being supplied from the spray nozzles 35a, 35b, 36a, and 36b to clean the film F, the cleaning liquid is collected by the treatment bath 12. This completes the overall circulation.

The circulation of the cleaning liquid and the process of feeding and cleaning the film F in the cleaning device 1, constructed as above, will now be described briefly. The cleaning liquid is pumped at a flow rate of 70 L/min by the feed pump 8 and passes through the filter 9 to remove impurities from it. Then, the cleaning liquid is sprayed to the film F from the spray nozzles 35a, 35b, 36a, and 36b in the treatment bath 12 with a high speed to remove impurities remaining on the surface of the film F.

After being sprayed, the cleaning liquid flows over the internal walls 11 of the treatment bath 12 and is collected by the discharge bath 15, which has a number of discharge openings 16 formed on its lower portion to return the cleaning liquid to the cleaning liquid reservoir 7 through them. The dipping depth of the film F can be adjusted by varying the vertical position of the lower guide roll 28. The slope of the feeding path of the film F can be controlled by varying the vertical position of the upper guide roll 18 and the feed rolls 19 (or conductive rolls). The cleaning liquid remaining on the surface of the film F can be removed by the pair of squeeze rolls 39a and 39b.

Figure 7:
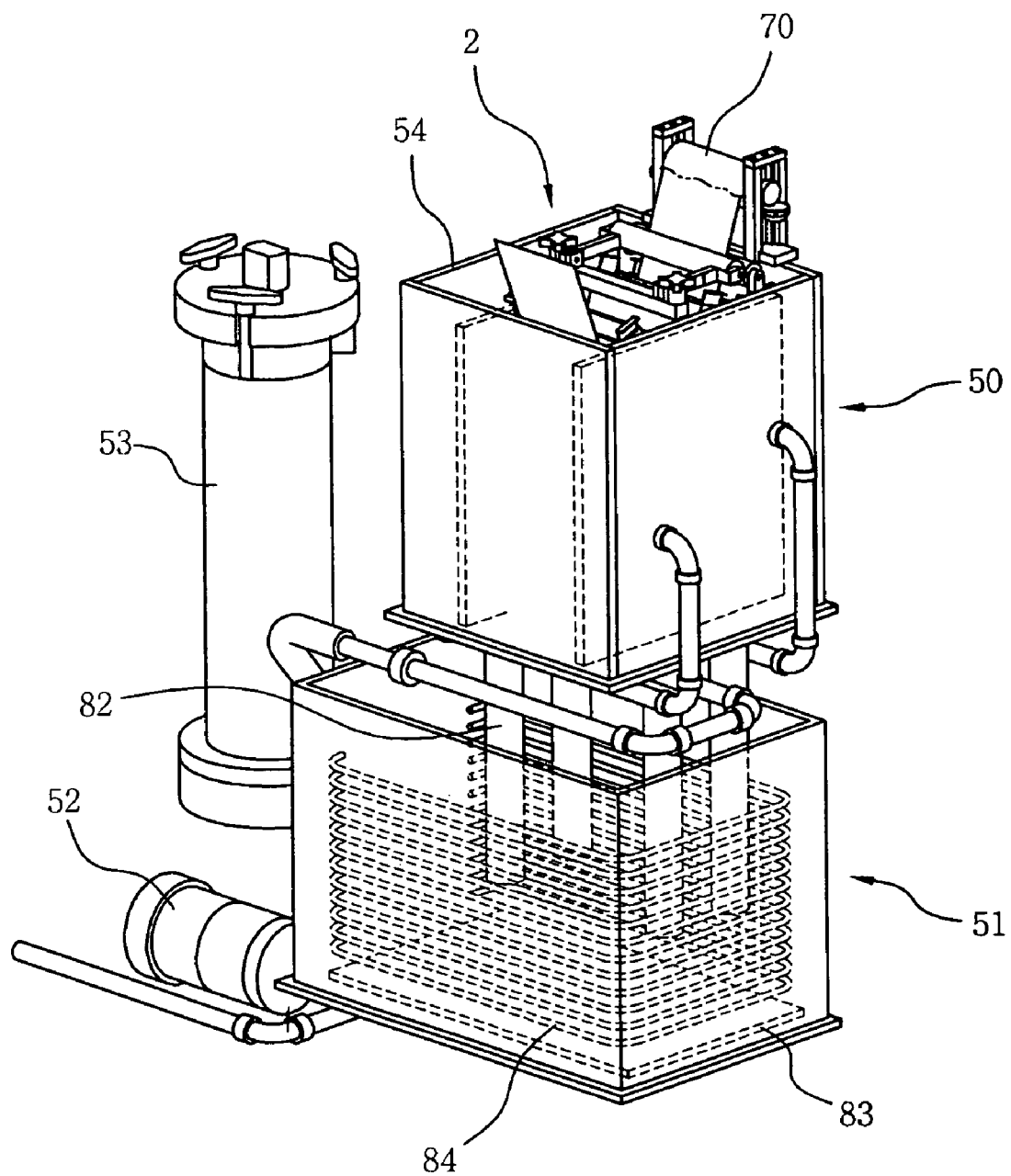
FIG. 7 is a perspective view briefly showing the overall construction of a copper plating device used in the flexible copper clad laminate film manufacturing system according to the present invention.
Figure 8:
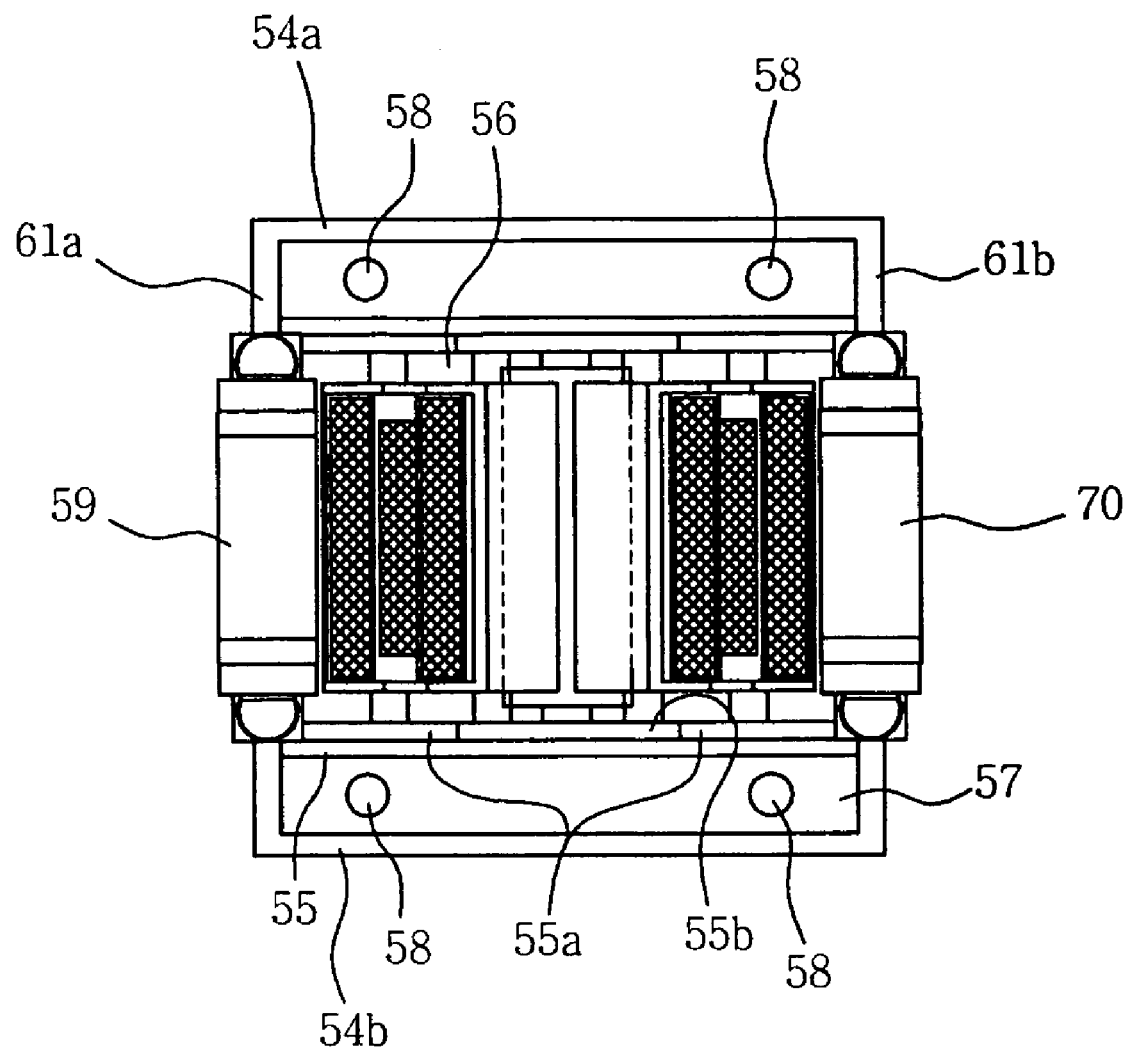
FIG. 8 is a top view briefly showing a plating bath used in the copper plating device shown in FIG. 7.
Figure 9:
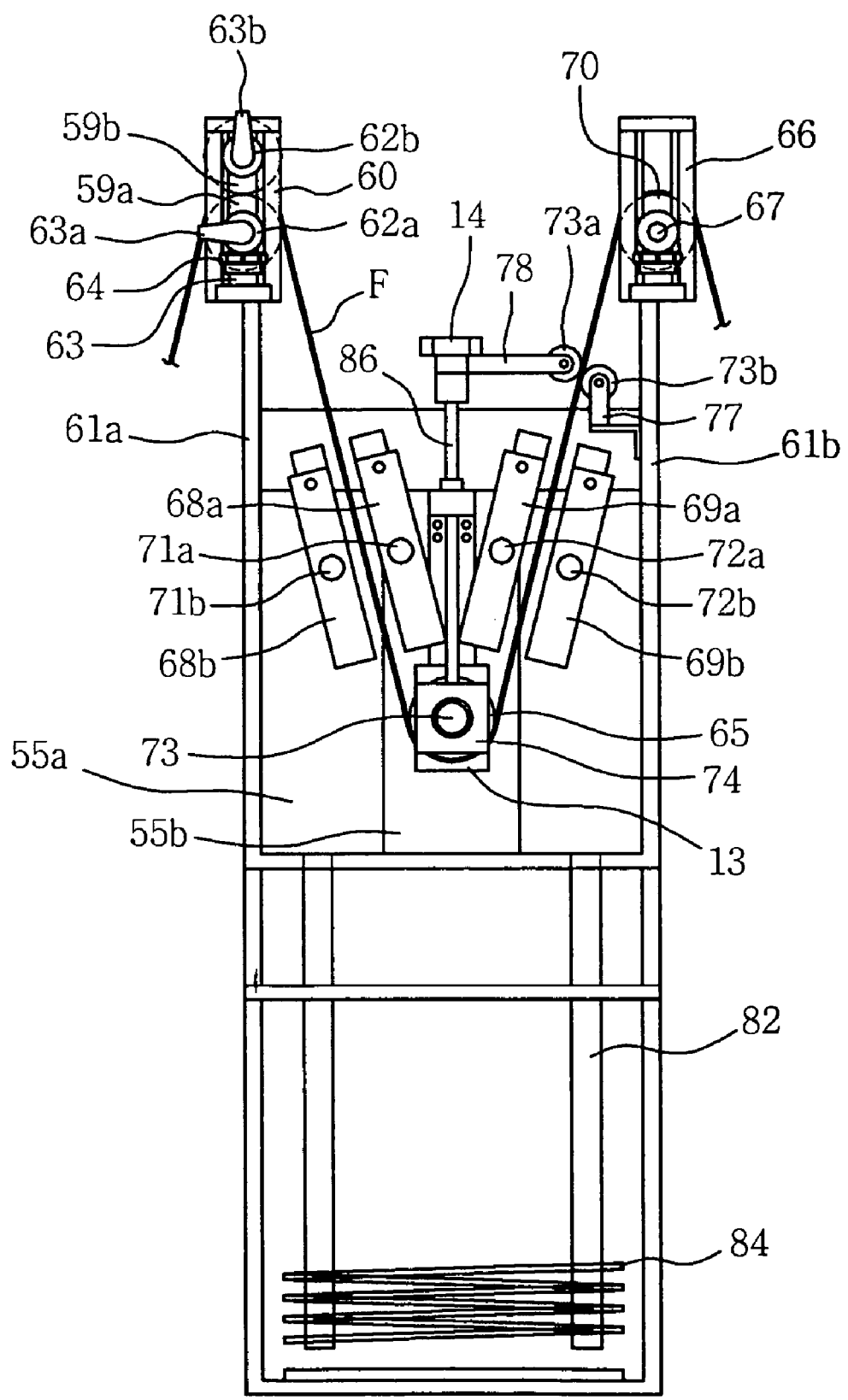
FIG. 9 is a lateral view of the copper plating device shown in FIG. 7.
Figure 10:
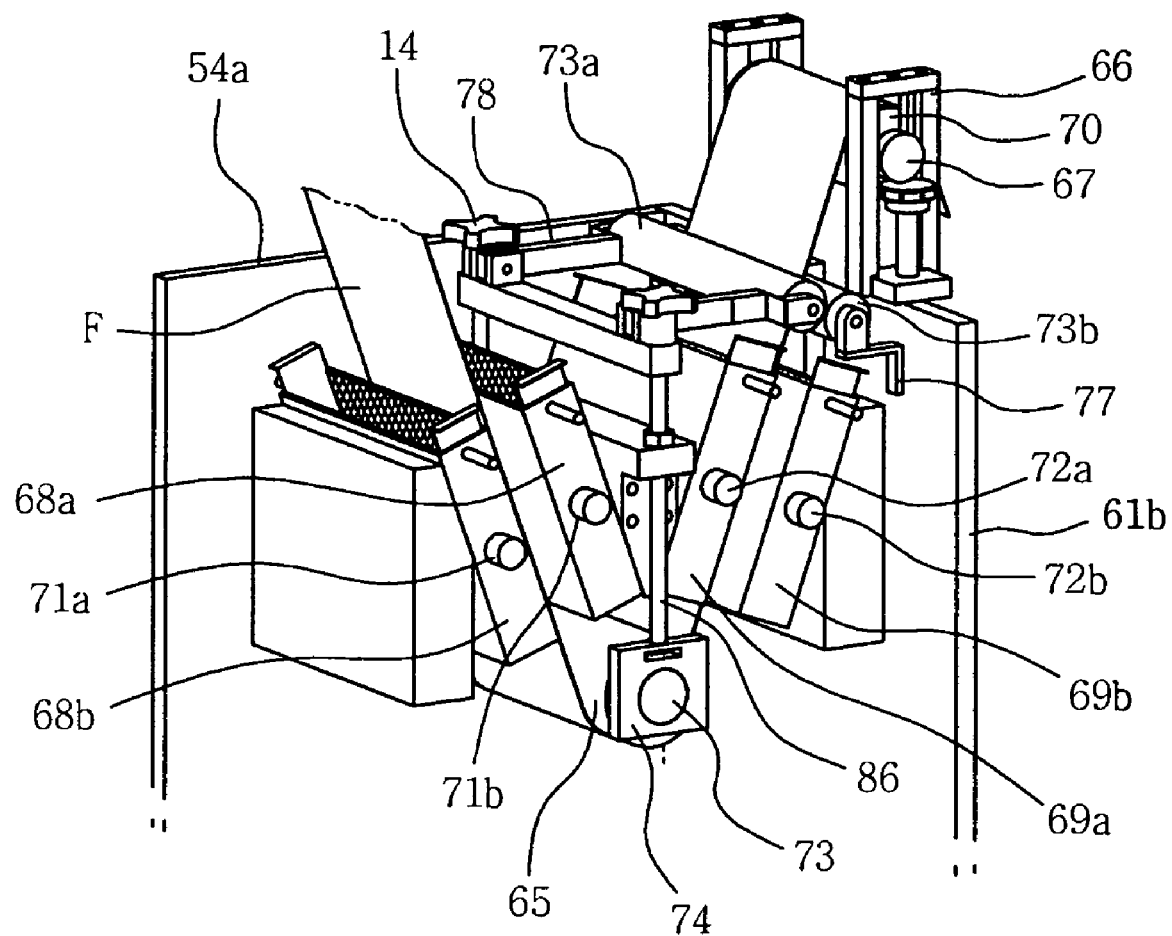
FIG. 10 is an exploded perspective view showing a plating bath with its conductive rolls and internal walls removed.
Figure 11:
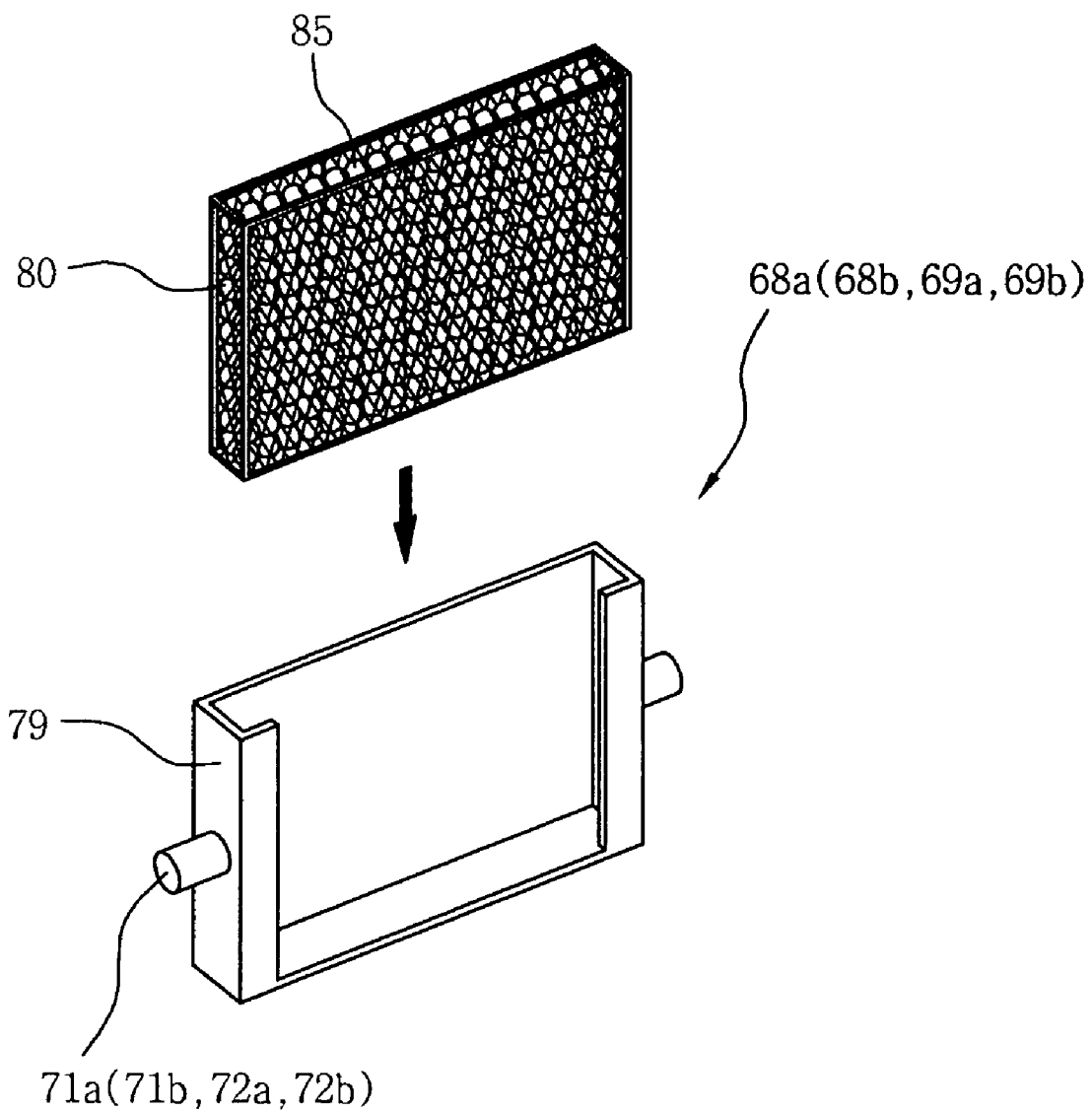
FIG. 11 is a perspective view showing the construction of a jig according to a preferred embodiment of the present invention.
Figure 12:
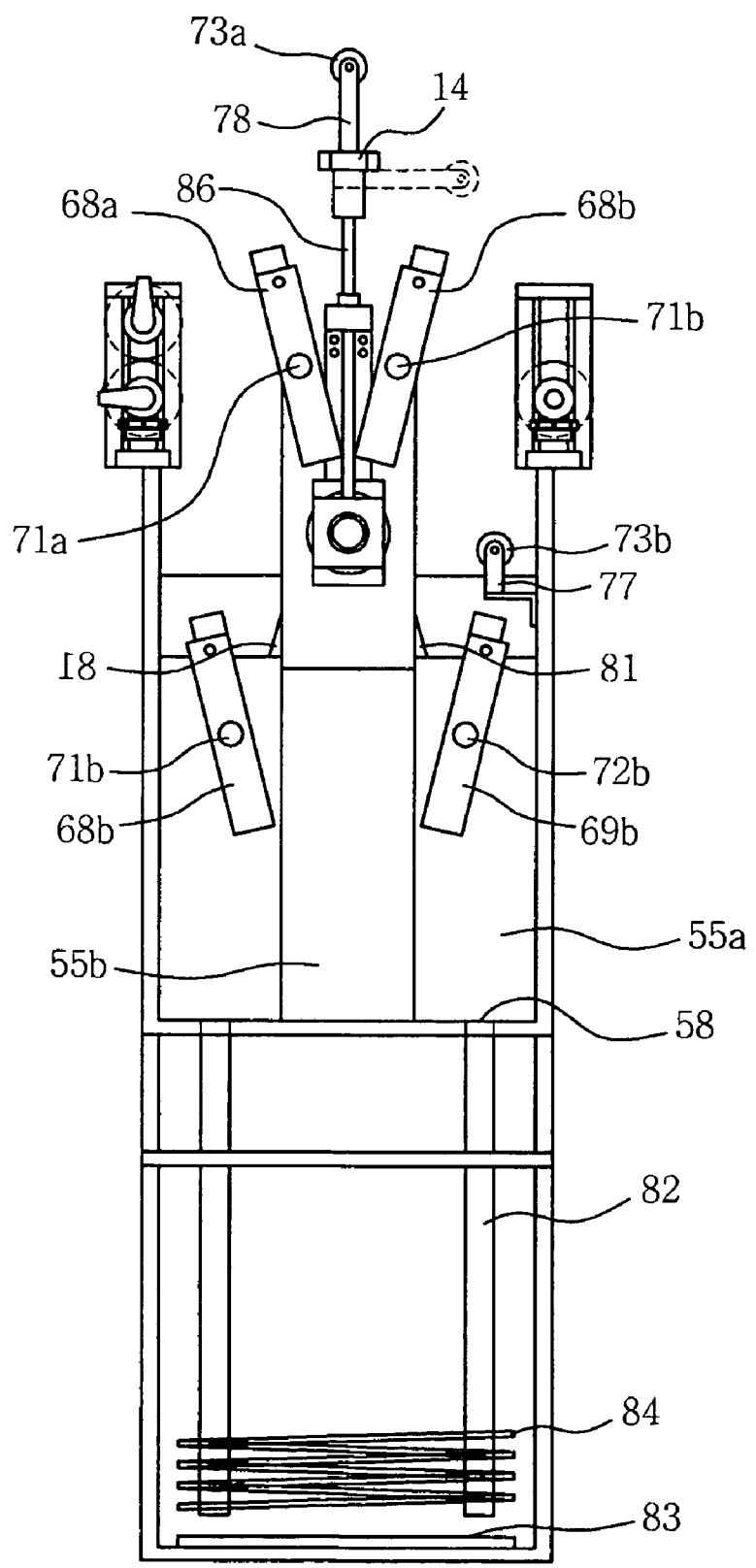
FIG. 12 is a lateral view of the copper plating device, shown in FIG. 7, with its movable lateral walls raised.

FIG. 7 is a perspective view briefly showing the overall construction of a copper plating device used in the flexible copper clad laminate film manufacturing system according to the present invention. FIG. 8 is a top view briefly showing a plating bath used in the copper plating device shown in FIG. 7. FIG. 9 is a lateral view of the copper plating device shown in FIG. 7. FIG. 10 is an exploded perspective view showing a plating bath with its conductive rolls and internal walls removed. FIG. 11 is a perspective view showing the construction of a jig according to a preferred embodiment of the present invention. FIG. 12 is a lateral view of the copper plating device shown in FIG. 7, with its movable lateral walls raised.

The copper plating device 2, as shown in FIG. 7, includes a plating bath 50, a plating liquid reservoir 51 positioned below the plating bath 50 for containing plating liquid such as copper electrolyte, a plating liquid supply pump 52, and a filter 53. Each component of the plating device 2 is positioned in a single support frame (not shown), as in the case of the cleaning device 1.

Referring to FIGS. 7 to 12, the plating bath 50, which is positioned on the upper portion of the copper plating device 2, includes an external case 54 having the shape of a box with an opened top, and a pair of internal walls 55, that are positioned to face each other while being spaced inwardly by a predetermined distance from both lateral walls 54a and 54b of the external case 54 in the inward direction. The height of the internal walls 55 is lower than that of the external case 54. The space between the internal walls 55 acts as a reaction bath 56. The space between each internal wall 55 and the external case 54 acts as a discharge bath 57.

The reaction bath 56 defined between the internal walls 55 contains copper electrolyte as plating liquid. The discharge bath 57 contains the copper electrolyte which flows over the internal walls 56 from the reaction bath 56. The discharge bath 57 has a number of discharge openings 58, that are formed on the lower surface thereof so that the copper electrolyte can be discharged via these openings to the plating liquid reservoir 51 positioned below the plating bath 50.

As shown in FIG. 8, stationary lateral walls 55a are positioned on both inner sides of the pair of internal walls 55, respectively, which are positioned inside the external case 54 of the plating bath 50. Movable lateral walls 55b are coupled between the respective stationary lateral walls 55a in such a manner that they can slide upwardly and downwardly.

The external case 54 has the pair of conductive rolls 59 positioned on a side thereof, as shown in FIGS. 8 and 9. The conductive rolls 59 are rotatably positioned in the upper and lower portions of a conductive roll support member 60, which is fixed to the upper portion of a front wall 61a, as in the case of the upper guide roll 18 of the cleaning device 1. The conductive roll support member 60 has a pair of elongated holes (not shown) extending in the vertical direction, to which both ends of shafts 62a and 62b of the conductive rolls 59 are fitted so that they can move vertically along the holes while being able to rotate about the shafts 62a and 62b, respectively.

The pair of conductive rolls 59, as shown in FIG. 9, include a first conductive roll 59a positioned below, so as to contact the lower surface of the film F, and a second conductive roll 59b positioned above, so as to press the upper surface of the film F against the first conductive roll 59a. Particularly, the first conductive roll 59a rotates with its outer peripheral surface contacting the lower surface of the film F to guide its feeding. The second conductive roll 59b is positioned on the upper surface of the film F and is adapted to rotate while pressing the upper surface of the film F to guide its feeding. The shafts 62a and 62b of the conductive rolls 59a and 59b have covers 63a and 63b positioned on both ends thereof, respectively, to hide connection terminals of the conductive rolls 59a and 59b. The outer peripheral surface of the conductive rolls 59a and 59b is made of titanium. The conductive rolls 59a and 59b are connected to an external current supply device (not shown) so that, while the film F is fed, negative (−) current is supplied to them and copper coatings of the film F contacting their outer peripheral surface are negatively charged.

As is clear from FIGS. 9 and 10, both sides of the shaft 62a are supported by height adjustment knobs 64, which have threaded shafts 63 screw-coupled to the conductive roll support member 60. By rotating the height adjustment knobs 64, therefore, the height of the conductive rolls 59 can be adjusted minutely.

As shown in the drawings, a lower guide roll 65 is rotatably positioned on the movable lateral walls 55b in the lower region of the plating bath 50 to guide the feeding of the film F, as in the case of the cleaning device 1. As mentioned above, the pair of movable lateral walls 55b are adapted to slide vertically at the center of the internal walls 55 and have rectangular holes 13 formed at the center of their lower portion while extending in the vertical direction. As shown in FIG. 9, both ends of shafts 73 of the lower guide roll 65 are rotatably supported by a slider 74, which is adapted to slide vertically along the rectangular holes 13 formed in the movable lateral walls 55b. The lower guide roll 65 rotates with its outer peripheral surface contacting the upper surface of the film F to guide the feeding of the film F inside the reaction bath 56.

A feed roll 70 is positioned on the upper portion of a rear wall 61b of the external case 54 while facing the conductive rolls 59. The feed roll 70 is rotatably coupled to a pair of feed roll support members 66, which are fixed to the rear wall 61b and have elongated holes (not shown) extending in the vertical direction. Both ends of a shaft 67 of the feed roll 70 are fitted into the elongated holes formed in the feed roll support member 66 so that the feed roll 70 can rotate about the shaft 67 and move vertically in the longitudinal direction of the elongated holes.

The lower guide roll 65, as detailed in FIGS. 9 and 12, has a shaft 73 positioned in a slider 74, which is fitted into rectangular holes 13 formed at the center of the lower portion of the pair of facing movable lateral walls 55b while extending in the vertical direction. The slider 74 is connected lower roll height adjustment knobs 14 via threaded shafts 86, which are screw-coupled to the upper portion of the movable lateral walls 55b.

As the slider 74 is lifted/lowered in the rectangular hole 13 by rotating the lower roll height adjustment knobs 14, the height of the lower guide roll 65 is adjusted minutely. As a result, the lower guide roll 65 can rotate with its outer peripheral surface contacting the upper surface of the film F in a correct position, and then guide the feeding of the film F inside the lower portion of the reaction bath 56.

As mentioned above, the conductive rolls 59 and the feed roll 70 are positioned in the upper region of the external case 54 and the lower guide roll 65 is positioned in the lower central region thereof between the conductive rolls 59 and the feed roll 70. As a result, the feeding path of the film F in the reaction bath 56 extends from its upper portion to the lower portion, where it bends and extends up to the upper portion. This means that the feeding bath generally has a V-shaped configuration when viewed in the lateral direction of the reaction bath 56, as in the case of the cleaning bath 1. The slope of the feeding path of the film F can be adjusted by varying the vertical position of the conductive rolls 59, the lower guide roll 65, and the feed roll 70. Particularly, the dipping depth of the film F into the reaction bath 56 depends on the vertical position of the lower guide roll 65.

As shown in FIGS. 9 and 10, a pair of jigs 68a and 68b are positioned on both sides of the feeding path of the film F between the conductive rolls 59 and the lower guide roll 65 in the reaction bath 56, respectively, and another pair of jigs 69a and 69b are positioned on both sides thereof between the lower guide roll 65 and the feed roll 70, respectively. As shown in FIG. 10, the jigs 68a, 68b, 69a, and 69b have the shape of a box with opened upper and front portions. The front portions of each pair of jigs are opened and face each other. The jigs 68a, 68b, 69a, and 69b are classified into inner jigs 68a and 69a and outer jigs 68b and 69b. The film F passes between the front portions of each pair of jigs, which faces each other. The jigs 68a, 68b, 69a, and 69b are made of titanium, as in the case of the rolls, and positive (+) current is supplied to them. When a copper electrolyte is contained in the reaction bath 56, therefore, the jigs 68a, 68b, 69a, and 69b are positively charged.

A pair of squeeze rolls 73a and 73b are positioned on the downstream of the feeding path of the film F between the jigs 68a, 68b, 69a, and 69b and the feed roll 70, as shown in FIGS. 9 and 10. Brackets 77 of the outer squeeze roll 73b is fixed to the upper portion of the rear wall 61b of the external case 54 and brackets 78 of the inner squeeze roll 73a is rotatably installed on the upper portion of the movable lateral walls 55b. The squeeze rolls 73a and 73b are sponge rolls made of polypropylene (PP), for example.

As shown in FIG. 11, the jigs 68a, 68b, 69a, and 69b include a case 79 having the shape of a box with opened upper and front portions and a basket 80 detachably coupled to the case 79 and made of a mesh to contain copper balls 85, which contain phosphorus to supplement copper ions to copper electrolyte contained in the reaction bath 56 when the jigs 68a, 68b, 69a, and 69b are dipped into it. The front portions of the jigs 68a, 68b, 69a, and 69b, which are opened inside the reaction bath 56, face the film F so that, when it passes between the jigs 68a, 68b, 69a, and 69b and is plated with copper plating layers on its upper and lower surfaces, the loss of copper ions from the copper electrolyte contained in the reaction bath 56 is efficiently compensated for by copper balls 85.

The inner jigs 68a and 69a have shafts 71a and 72a rotatably positioned on the movable lateral walls 55b and the outer jigs 68a and 69b have shafts 71b and 72b rotatably positioned on the stationary lateral walls 55a. As the inner squeeze roll 73a pivots away from the film F, particularly, from a position indicated by dotted lines in FIG. 12 and to that indicated by solid lines, the movable lateral walls 55b are raised between the stationary lateral walls 55a. As a result, the inner jigs 68a and 69a, the lower guide roll 65, and the inner squeeze roll 73a can be raised together with the movable walls 55b. After being raised, the movable lateral walls 55b are supported on the stationary lateral walls 55a by supporters 81 positioned on their power portion so that they remain in the raised position. In this position, various members can be easily repaired, or the reaction bath 56 can be easily repaired and cleaned.

As the outer jigs 68b and 69b and the inner jigs 68a and 69a are rotatably installed to the stationary lateral walls 55a and the movable lateral walls 55b, respectively, their installation angle can be adjusted by varying the slope of the feeding path of the film F, which depends on the vertical position of the conductive rolls 59, the lower guide roll 65, and the feed roll 70 in the elongated holes. As a result, the film F is spaced the same distance from the outer jigs 68b and 69b and the inner jigs 68a and 69a, which face each other, and is fed while being parallel to them. This is advantageous in that the film F has copper plating layers formed on the upper and lower surfaces thereof with a uniform thickness.

The plating bath 50, constructed as described above, has a plating liquid reservoir 51 positioned on its lower portion, which has the shape of a box with an opened top. Four discharge tubes 82 extend into the plating liquid reservoir 51 while being connected to the discharge openings 58, which are formed on the lower portion of the discharge bath 57 on both sides of the reaction bath 56. Meanwhile, the temperature of the copper electrolyte contained in the plating liquid reservoir 51 is a critical factor in the plating process. In order to maintain a suitable temperature of the copper electrolyte, the plating liquid reservoir 51, in which the copper electrolyte is reserved, has a coil heater 83 positioned on its lower portion and a cooling coil 84 positioned above the coil heater 83 while extending upwards and being wound around the four discharge tubes 82, as shown in FIGS. 9 and 12. In addition, the plating liquid reservoir 51 has a temperature sensor (not shown) positioned therein to detect the temperature of the electrolyte reserved therein.

As shown in FIG. 7, the plating liquid reservoir 51 has a feed pump 52 positioned on the lower portion of its lateral surface while being connected to the lower portion of the reservoir via a conduit to draw the copper electrolyte from the plating liquid reservoir 51 and sent it to the filter 53. The filter 53 is positioned on top of the feed pump 52 and is connected to it via a conduit (not shown) to remove impurities from the copper electrolyte pumped by the feed pump 52. The circulation of the copper electrolyte is identical to that of the cleaning liquid in cleaning device 1 and repeated description thereof will therefore be omitted.

The circulation of the copper electrolyte and the process of feeding and plating the film F in the plating device 2, constructed as above, will now be described briefly. The copper electrolyte in the plating liquid reservoir 51 is compressed by the feed pump 53 and passes through the filter 53 at a flow rate of 80 L/min. Then, the copper electrolyte is sprayed to the film F via a conduit 85 leading to the reaction bath 56. After being sprayed, the copper electrolyte flows over the internal walls 55 of the reaction bath 56 and is collected by the discharge bath 57 for circulation.

As mentioned above, the dipping depth of the film F into working liquid is adjusted by varying the vertical position of the lower guide roll 65 and the slope is controlled by changing the vertical position of both ends of the conductive rolls 59 and the feed roll 70. The flow rate can be regulated by a valve (not shown). Negative (−) current is supplied to the film F via the pair of conductive rolls 59, and positive (+) current is supplied to the pairs of jigs 68a, 68b, 69a, and 69b, which contain copper balls including phosphorous. As the negatively-charged film F is dipped into the copper electrolyte in the plating bath 50 and passes between the outer jigs 68b and 69b and the inner jigs 68a and 69a, which are positively charged, copper plating layers are formed on copper coatings on the upper and lower surfaces of the film F. The copper electrolyte remaining on the surface of the copper plating layers are moved when the film F passes between the pair of squeeze rolls 73a and 73b.

After copper plating layers are formed on the copper coatings in the plating device 2, the film F is subjected to antirust treatment in the antirust device 4 to prevent the copper plating layers from rusting. After the antirust treatment, the film F passes through the drying device 5 and is dried by hot air, as shown in FIG. 1. Then, the film Ff is wound around the winding device 102 into a roll.

INDUSTRIAL APPLICABILITY

As can be seen from the foregoing, the FCCL manufacturing apparatus according to the present invention uses a pair of conductive rolls, which are positively charged, and jigs positioned in the plating bath while facing each other, which are negatively charged, to efficiently electroplate a polyimide-based film and form copper plating layers on its both surfaces.

In addition, impurities remaining on both surfaces of the plated film are efficiently removed, and the apparatus is easy to maintain and repair.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

What is claimed is:

1. A flexible copper clad laminate film manufacturing system for continuously plating a to-be-plated film, which has copper coatings on both surfaces thereof, to form copper plating layers on both surfaces of the film while it is fed, the system comprising:
   a pickling device adapted to spray a pickling liquid to both surfaces of the to-be-plated film to remove oxide coatings from the copper coatings;
   a number of water-cleaning devices for removing the pickling liquid and copper electrolyte remaining on the film;
   at least one plating device positioned between the water-cleaning devices to form copper plating layers on both surfaces of the film;
   an antirust device for preventing the copper plating layers, which have been formed by the plating device, from rusting; and
   a drying device for drying the antirust liquid on the film, which has been subjected to antirust treatment;
   wherein at least one of the pickling device, the water-cleaning devices, the plating device, and the antirust device comprise a lower guide roll that guides the to-be-plated film into a treatment bath and wherein the lower guide roll is selectively adjustable to various depths within the treatment bath; and
   wherein the lower guide roll is positioned on a lower portion of a pair of movable lateral walls, which are vertically slidable relative to the treatment bath and which are positioned on both sides of an internal center of the treatment bat in such a manner that the movable lateral walls can slide, to guide the film while it is fed.

2. The flexible copper clad laminate film manufacturing system as claimed in claim 1, wherein the pickling and water-cleaning devices comprise:
   a cleaning bath for containing a cleaning liquid to clean the to-be-plated film;
   a cleaning liquid reservoir for reserving a cleaning liquid to be supplied to the cleaning bath;
   a feed pump for pumping the cleaning liquid to the cleaning bath to spray it to the film and supplying the cleaning liquid to the cleaning liquid reservoir; and
   a filter for removing alien substances from the cleaning liquid supplied to the cleaning bath.

3. The flexible copper clad laminate film manufacturing system as claimed in claim 2, wherein the cleaning bath comprises:
   the treatment bath being configured for containing a cleaning liquid to clean the to-be-plated film while it is fed;
   an upper guide roll and a feed roll rotatably positioned on the front upper portion and rear portion of the treatment bath, respectively, to guide the film; and
   a number of pairs of spray nozzles positioned on the treatment bath and the movable lateral walls between the upper guide roll and the lower guide roll, as well as between the lower guide roll and the feed roll, to spray a cleaning liquid to both surfaces of the film while it is fed.

4. The flexible copper clad laminate film manufacturing system as claimed in claim 3, wherein the cleaning bath further comprises a pair of squeeze rolls positioned on the spray nozzles between the lower guide roll and the feed roll, respectively, to remove the cleaning liquid from the to-be-plated film.

5. The flexible copper clad laminate film manufacturing system as claimed in claim 3, wherein the height of the upper guide roll, the lower guide roll, and the feed roll is minutely adjusted by threaded screws.

6. The flexible copper clad laminate film manufacturing system as claimed in claim 1, wherein the copper plating device comprises:
 conductive rolls for supplying negative current to the copper coatings formed on both surfaces of the to-be-plated film;
 a plating bath adapted to contain a plating liquid, into which the film is dipped while being fed, and provided with a number of pairs of jigs, to which positive current is supplied to form copper plating layers on the copper coatings of the film while it passes between them;
 a plating liquid reservoir positioned below the plating bath;
 a plating liquid supply pump for supplying a plating liquid from the plating liquid reservoir to the plating bath; and
 a filter for removing alien substances from the plating liquid supplied to the plating bath.

7. The flexible copper clad laminate film manufacturing system as claimed in claim 1, further comprising a supply device positioned on the front end of the pickling device to wind the to-be-plated film into a roll wound it and a winding device positioned on the rear end of the drying device to feed the film in such a manner that it passes through the pickling device, the water-cleaning devices, and the copper plating device at a predetermined speed.

8. A cleaning device for manufacturing flexible copper clad laminate film comprising:
 a cleaning bath having an upper guide roll and a feed roll rotatably positioned on the front upper portion and rear portion thereof, respectively, to guide a to-be-plated film having copper coatings formed on its both surfaces, a lower guide roll that is both vertically adjustable relative to and carried by the lower portion of a pair of movable lateral walls, which are positioned on both sides of the internal center in such a manner that they can slide, to guide the film while it is fed, and a number of pairs of spray nozzles positioned on external lateral walls and the movable lateral walls between the upper guide roll and the lower guide roll, as well as between the lower guide roll and the feed roll, to spray a cleaning liquid to both surfaces of the film while it is fed, wherein the movable lateral walls are vertically slidable relative to the external lateral walls;
 a cleaning liquid reservoir for reserving a cleaning liquid to be supplied to the cleaning bath;
 a feed pump for pumping the cleaning liquid to the cleaning bath to spray it to the film and supplying the cleaning liquid from an external cleaning liquid tank to the cleaning liquid reservoir; and
 a filter for removing alien substances from the cleaning liquid supplied to the cleaning bath.

9. The cleaning device as claimed in claim 8, wherein the cleaning bath has an external case having the shape of a box with an open top, a treatment bath positioned at the center of the external case to clean the to-be-plated film, and a pair of internal walls adapted to delimit a discharge bath for discharging the cleaning liquid, which overflows from the treatment bath, to the cleaning liquid reservoir, and each internal wall has stationary lateral walls positioned on both sides of its inner portion and one of the pair of movable lateral walls is adapted to slide vertically between the stationary lateral walls.

10. The cleaning device as claimed in claim 8, wherein the cleaning bath further comprises a pair of squeeze rolls positioned on the spray nozzles between the lower guide roll and the feed roll, respectively, to remove the cleaning liquid from the to-be-plated film.

11. The cleaning device as claimed in claim 8, wherein the height of the upper guide roll, the lower guide roll, and the feed roll is minutely adjusted by threaded screws.

12. The cleaning device as claimed in claim 8, wherein a slider is positioned to move vertically in rectangular holes formed in the movable lateral walls.

13. A copper plating device for manufacturing flexible copper clad laminate film comprising:
 a plating bath having conductive rolls positioned on the front upper portion thereof to guide a to-be-plated film and supply negative current to copper coatings formed on both surfaces of the film, a feed roll positioned on the rear upper portion to feed the film, a lower guide roll that is both vertically adjustable relative to and carried by the lower portion of a pair of movable lateral walls, which are positioned at the center in such a manner that they can slide vertically relative to the plating bath, to guide the film while it is fed, and a number of pairs of jigs, to which positive current is supplied to form copper plating layers on the copper coatings of the film while it passes between them, the plating bath containing a plating liquid, into which the film is dipped while being fed;
 a plating liquid reservoir positioned below the plating bath;
 a plating liquid supply pump for supplying a plating liquid from the plating liquid reservoir to the plating bath; and
 a filter for removing alien substances from the plating liquid supplied to the plating bath.

14. The copper plating device as claimed in claim 13, wherein the plating bath has an external case having the shape of a box with an open top and a pair of internal walls spaced a predetermined distance from both lateral walls of the external case in the inward direction, respectively, to delimit a reaction bath at the center for plating the to-be-plated film and a discharge bath for discharging the plating liquid, which overflows from the reaction bath, to the plating liquid reservoir, and each internal wall has stationary lateral walls positioned on both sides of its inner portion and one of the pair of movable lateral walls is adapted to slide vertically between the stationary lateral walls.

15. The copper plating device as claimed in claim 13, wherein the plating bath further comprises a pair of squeeze rolls positioned on the jigs between the lower guide roll and the feed roll, respectively, to remove the plating liquid from the to-be-plated film.

16. The copper plating device as claimed in claim 13, wherein the height of the conductive rolls, the lower guide roll, and the feed roll is minutely adjusted by threaded screws.

17. The copper plating device as claimed in claim 13, wherein a slider that carries the lower guide roll is positioned to move vertically in rectangular holes formed in the movable lateral walls.

18. The copper plating device as claimed in claim 13, wherein the jigs comprise a case having an open surface, which faces the to-be-plated film, and a basket positioned in the case while containing copper balls for supplementing copper ions to a copper electrolyte.

* * * * *